(12) United States Patent
Yamazaki et al.

(10) Patent No.: US 8,940,628 B2
(45) Date of Patent: Jan. 27, 2015

(54) METHOD OF MANUFACTURING INTERCONNECTION AND SEMICONDUCTOR DEVICE

(71) Applicant: Kabushiki Kaisha Toshiba, Minato-ku (JP)

(72) Inventors: Yuichi Yamazaki, Tokyo (JP); Tadashi Sakai, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/140,731

(22) Filed: Dec. 26, 2013

(65) Prior Publication Data

US 2014/0187033 A1    Jul. 3, 2014

(30) Foreign Application Priority Data

Dec. 27, 2012   (JP) .................. 2012-284912

(51) Int. Cl.
   *H01L 21/768*    (2006.01)
   *H01L 23/522*    (2006.01)
   *H01L 23/532*    (2006.01)
   (Continued)

(52) U.S. Cl.
   CPC .... *H01L 21/76877* (2013.01); *H01L 21/28556* (2013.01); *H01L 21/76844* (2013.01); *H01L 21/28562* (2013.01); *B82Y 40/00* (2013.01); *C01B 31/0226* (2013.01); *H01L 23/5226* (2013.01); *H01L 23/53276* (2013.01);
   (Continued)

(58) Field of Classification Search
   CPC .................. H01L 21/76877; H01L 21/76879;
   H01L 21/76844; H01L 21/28556; H01L 21/28562; H01L 2221/1094; H01L 23/5226; H01L 23/53276; C01B 31/0226; B82Y 40/00
   USPC .................. 438/610; 977/742, 762, 842, 843
   See application file for complete search history.

(56) References Cited

U.S. PATENT DOCUMENTS 6,800,886 B2 * 10/2004 Awano .......................... 257/276
7,084,053 B2 * 8/2006 Golzarian et al. ............. 438/610
(Continued)

FOREIGN PATENT DOCUMENTS

JP    2011-230980 A    11/2011
JP    2012-49261       3/2012

OTHER PUBLICATIONS

Office Action issued Feb. 25, 2014 in Japanese Patent Application No. 2012-284912 (with English language translation).

*Primary Examiner* — Mary Wilczewski
(74) *Attorney, Agent, or Firm* — Oblon, Spivak, McClelland, Maier & Neustadt, L.L.P.

(57) ABSTRACT

A method of manufacturing an interconnection of an embodiment includes: forming a via which penetrates an interlayer insulation film on a substrate; forming an underlying film in the via; removing the underlying film on a bottom part of the via; forming a catalyst metal inactivation film on the underlying film; removing the inactivation film on the bottom part of the via; forming a catalyst metal film on the bottom part of the via on which the inactivation film is removed; performing a first plasma treatment and a second plasma treatment using a gas not containing carbon on a member in which the catalyst metal film is formed; forming a graphite layer on the catalyst film after the first and second plasma treatment processes; and causing a growth of a carbon nanotube from the catalyst film on which the graphite layer is formed.

28 Claims, 11 Drawing Sheets

(51) Int. Cl.
  *B82Y 40/00* (2011.01)
  *H01L 21/285* (2006.01)
  *C01B 31/02* (2006.01)

(52) U.S. Cl.
  CPC ... *H01L21/76879* (2013.01); *H01L 2221/1094* (2013.01); *Y10S 977/742* (2013.01); *Y10S 977/762* (2013.01); *Y10S 977/842* (2013.01); *Y10S 977/843* (2013.01)
  USPC ........... 438/610; 977/742; 977/762; 977/842; 977/843

(56) References Cited

U.S. PATENT DOCUMENTS

| | | | |
|---|---|---|---|
| 7,135,773 B2 * | 11/2006 | Furukawa et al. | 257/758 |
| 7,960,277 B2 * | 6/2011 | Nihei | 438/637 |
| 7,982,318 B2 * | 7/2011 | Heo et al. | 257/774 |
| 8,399,772 B2 * | 3/2013 | Gosset et al. | 174/250 |
| 8,461,037 B2 * | 6/2013 | Wu et al. | 438/618 |
| 8,624,396 B2 * | 1/2014 | Wu et al. | 257/758 |
| 8,710,672 B2 * | 4/2014 | Katagiri et al. | 257/774 |
| 2006/0091557 A1 * | 5/2006 | Sakamoto et al. | 257/774 |
| 2007/0020168 A1 * | 1/2007 | Asmussen et al. | 423/447.3 |
| 2009/0206483 A1 * | 8/2009 | O'Brien | 257/746 |
| 2010/0264544 A1 * | 10/2010 | Heo et al. | 257/768 |
| 2012/0040523 A1 * | 2/2012 | Kondo | 438/610 |
| 2012/0049370 A1 | 3/2012 | Wada et al. | |
| 2012/0135598 A1 * | 5/2012 | Wu et al. | 438/610 |
| 2013/0059091 A1 | 3/2013 | Matsumoto et al. | |
| 2013/0334689 A1 * | 12/2013 | Wu et al. | 257/746 |
| 2014/0138829 A1 * | 5/2014 | Zhao et al. | 257/746 |
| 2014/0187033 A1 * | 7/2014 | Yamazaki et al. | 438/610 |

* cited by examiner

METHOD OF MANUFACTURING INTERCONNECTION AND SEMICONDUCTOR DEVICE

CROSS-REFERENCE TO RELATED APPLICATION

This application is based upon and claims the benefit of priority from Japanese Patent Application No. 2012-284912 Dec. 27, 2012; the entire contents of which are incorporated herein by reference.

FIELD

Embodiments described herein relate generally to a method of manufacturing an interconnection and a semiconductor device.

BACKGROUND

A carbon nanotube (CNT) is a material which is obtained by forming graphene as a two-dimensional nano material made of carbon atoms into a tube shape. As in the graphene, the CNT has excellent physical properties such as high current density resistance, ballistic conduction, high thermal conductivity, or high mechanical strength and thus is regarded as a promising interconnection material of a semiconductor device. Particularly, since the CNT is a material having a greatly high aspect ratio in which a length is 1 µm or more and 1 cm or less with respect to a diameter of 1 nm or more and 10 nm or less, it is suited for an interconnection (via interconnection) of a semiconductor device in a vertical direction. In order to form the via interconnection using the CNT, it is easiest to cause a growth of the CNT from a bottom part of a via. It is essential to use metal particulates as a catalyst so as to cause the growth of high-quality CNT. Accordingly, when a manufacturer wants to selectively grow the CNT from the bottom part of the via, it is easiest to form the catalyst metal particulates only on the bottom part of the via. Specifically, an extremely thin catalyst metal film (1 nm or more and 3 nm or less) maybe deposited before a via forming process. In some cases, however, such a thin film will adversely affect a device operation or others depending on a device. Further, there is also a method of forming a thin catalyst metal film only on the bottom of the via, but it is necessary to make misalignment of the patterning very small.

The method of depositing the thin catalyst metal film after the formation of the via can solve these problems and does not depend on a device structure, thereby having high practicality. Due to characteristics of thin film deposition technique, however, the thin catalyst metal film is deposited on the entire surface (bottom of the via, sidewalls and outermost surface of the via), resulting in causing the growth of the CNT from the entire surface. The CNT growing from the sidewalls of the via prevents the CNT growth from the bottom of the via, thus making a critical problem in that a function as a via interconnection is damaged. In addition, the CNT growing from the outermost surface makes it difficult to perform a CMP (Chemical Mechanical Polishing) process which is a post-process.

DETAILED DESCRIPTION

A method of manufacturing an interconnection of an embodiment includes: forming a via which penetrates an interlayer insulation film of a member provided with the interlayer insulation film on a substrate; forming an underlying film in the via; removing the underlying film on a bottom part of the via; forming a catalyst metal inactivation film on the underlying film; removing the catalyst metal inactivation film on the bottom part of the via; forming a catalyst metal film on the bottom part of the via on which the catalyst metal inactivation film is removed; performing a first plasma treatment and a second plasma treatment using a gas not containing carbon on a member in which the catalyst metal film is formed; forming a graphite layer on the catalyst metal film after the first and second plasma treatment processes; and causing a growth of a carbon nanotube from the catalyst metal film on which the graphite layer is formed. A plasma gas pressure of the first plasma treatment is higher than that of the second plasma treatment.

A method of manufacturing a semiconductor device of an embodiment includes: forming a via which penetrates an interlayer insulation film of a member provided with the interlayer insulation film on a substrate; forming an underlying film in the via; removing the underlying film on a bottom part of the via; forming a catalyst metal inactivation film on the underlying film; removing the catalyst metal inactivation film on the bottom part of the via; forming a catalyst metal film on the bottom part of the via on which the catalyst metal inactivation film is removed; performing a first plasma treatment and a second plasma treatment using a gas not containing carbon on a member in which the catalyst metal film is formed; forming a graphite layer on the catalyst metal film after the first and second plasma treatment processes; and causing a growth of a carbon nanotube from the catalyst metal film on which the graphite layer is formed. The method of manufacturing the semiconductor device employs a method of manufacturing an interconnection in which a plasma gas pressure of the first plasma treatment is higher than that of the second plasma treatment.

Hereinafter, a semiconductor device, an interconnection, and methods of manufacturing the semiconductor device and the interconnection will be described with reference to the drawings as necessary. In addition, for example, the interconnection according to embodiments indicates an interconnection of the semiconductor device.

(First Embodiment)

Figure 1:
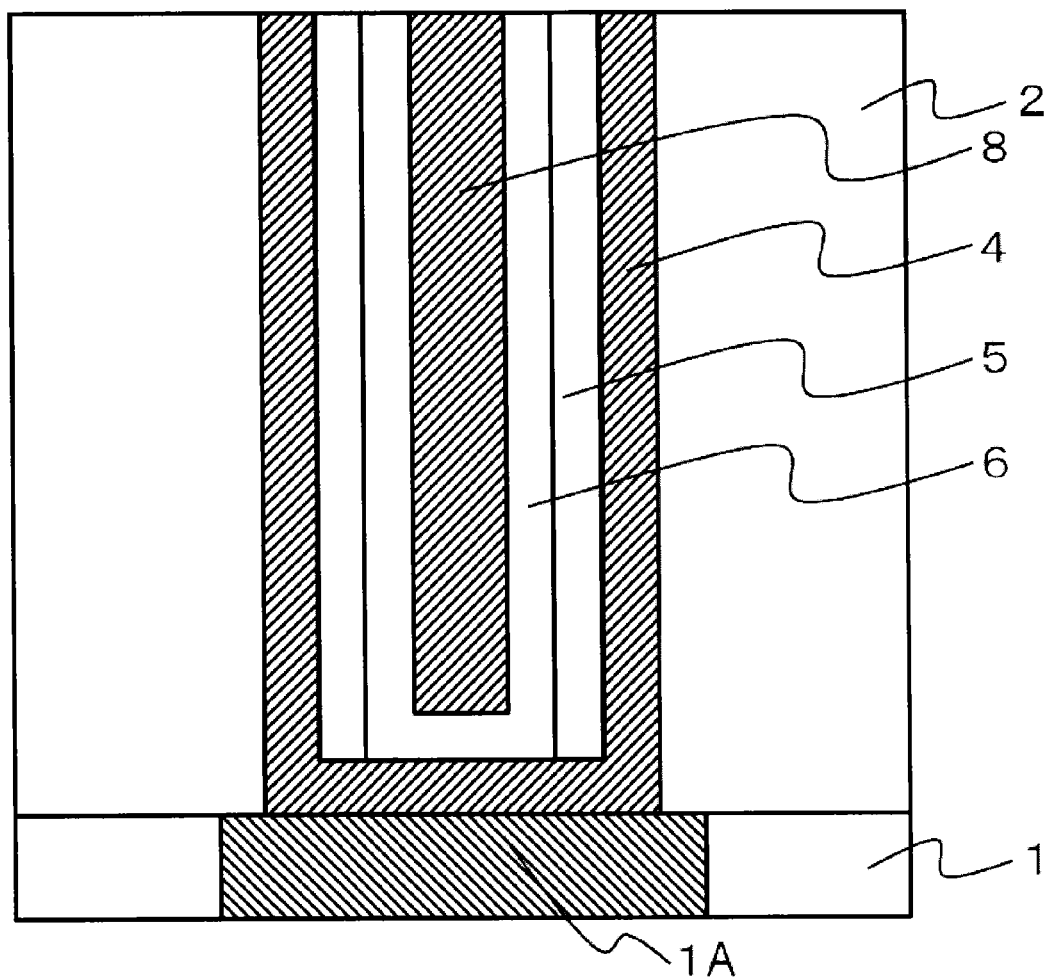
FIG. 1 is a schematic cross-sectional diagram of a semiconductor device including an interconnection of an embodiment.

FIG. 1 is a schematic cross-sectional diagram of a part of a semiconductor device such as an LSI having an interconnection according to a first embodiment. The semiconductor device illustrated in FIG. 1 includes an interconnection substrate 1, an interlayer insulation film 2 on the interconnection substrate 1, a via 3 which penetrates the interlayer insulation film 2, an underlying film 4 formed on sidewalls and a bottom part of the via 3, a catalyst metal inactivation film 5 on the underlying film 4 formed on the sidewalls of the via 3, a catalyst metal film 6 which is formed on the underlying film 4 of the bottom part of the via 3 and on the catalyst metal inactivation film 5 of the sidewalls of the via 3, and a carbon interconnection including a CNT extending from the bottom part of the via 3. A via interconnection is electrically connected to an upper interconnection disposed at an upper surface of the via, which is not illustrated in the drawing, to act as an interlayer interconnection of a multilayer substrate.

An example of a manufacturing method of forming the via interconnection illustrated in the schematic diagram of FIG. 1 will be described below.

Figure 2:
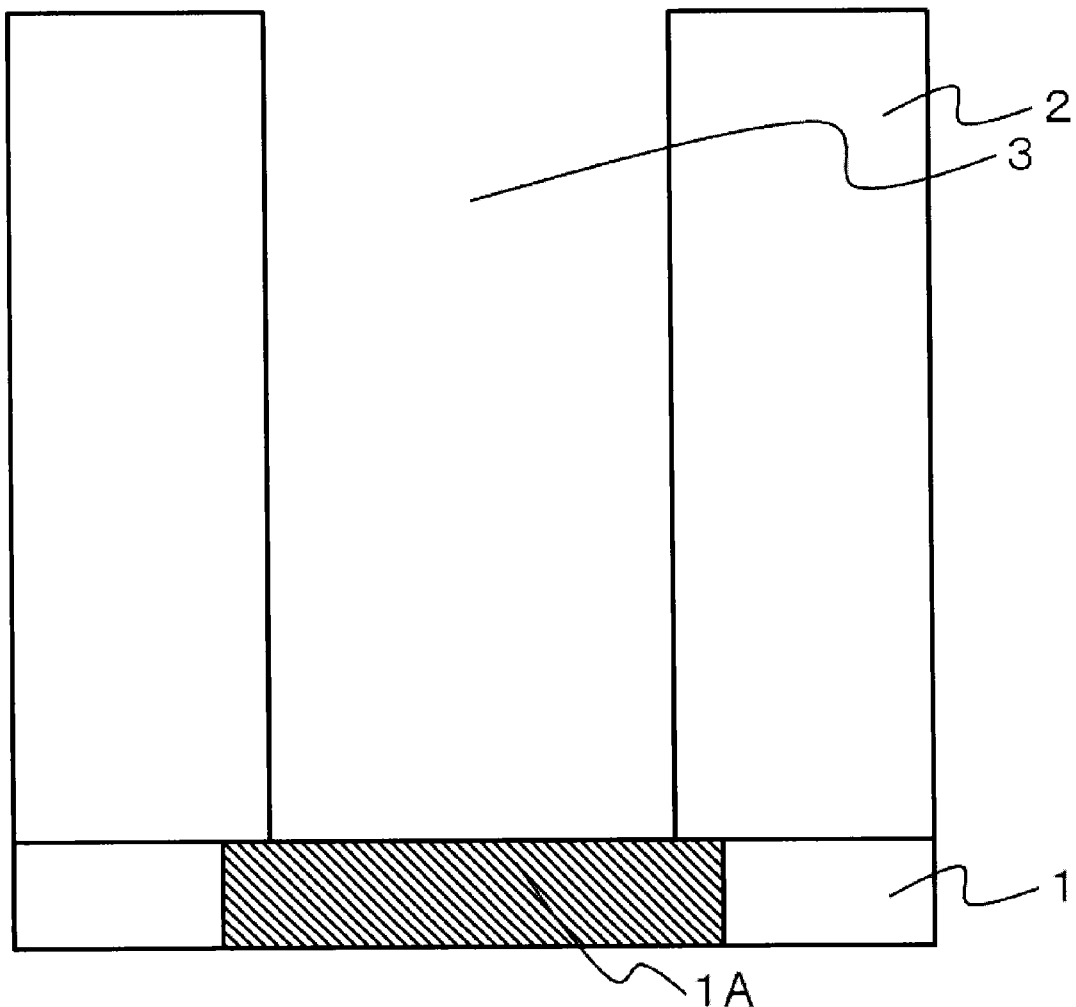
FIG. 2 is a schematic cross-sectional diagram of a process according to a method of manufacturing an interconnection of the embodiment.

FIG. 2 is a schematic cross-sectional diagram of an interconnection which is a member provided with the interconnection substrate 1 and the interlayer insulation film 2 on the interconnection substrate 1 and in which the via 3 penetrating the interlayer insulation film 2 is formed.

The interconnection substrate 1 is a substrate in which an underlying interconnection 1A such as a semiconductor integrated circuit is formed. A part of the semiconductor integrated circuit can be electrically connected to the interlayer interconnection formed in the via 3. The interlayer insulation film 2 is an insulation film. Preferably, the interlayer insulation film 2 is a low-dielectric insulation film such as SiOC. The via 3 is a region in which the interlayer interconnection is formed. For example, the via 3 is formed on the underlying interconnection 1A. The diameter of the via 3 has a nano-order size such as 100 nm. For example, the via 3 can be formed to penetrate the interlayer insulation film 2 up to the interconnection substrate 1 by a dry etching using a fluorine-based gas. For example, the diameter of the via 3 is 10 nm or more and 100 nm or less. When the depth of the via 3 is too swallow, there is a case where a desired process is not performed. For example, when the depth of the via 3 is 500 nm or more, it is possible to form a desired interconnection by the following processes. Preferably, the depth of the via 3 is 1 μm or more and 100 μm or less. When an aspect ratio (depth/diameter) of the via 3 is 10 or more, it is possible to preferably perform the desired process.

Figure 3:
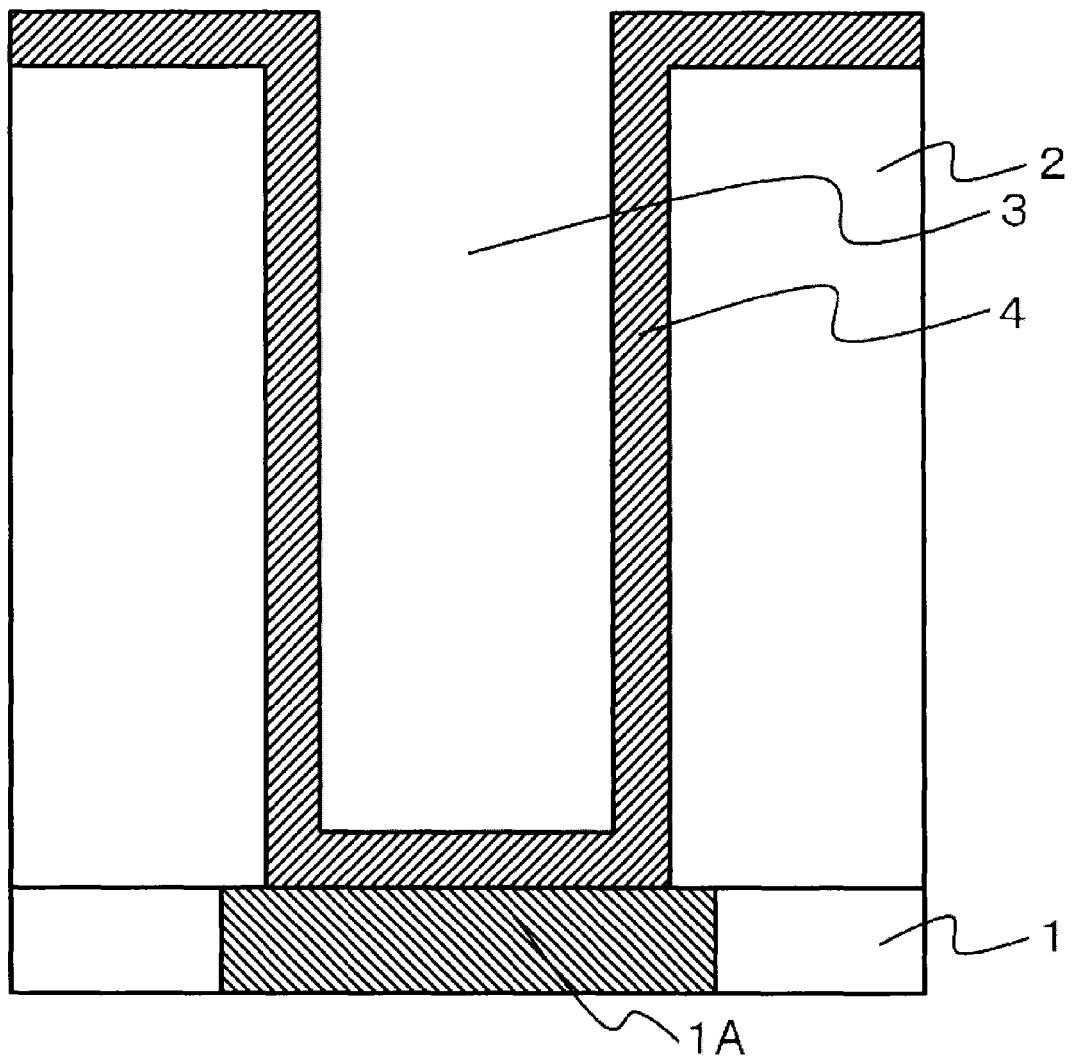
FIG. 3 is a schematic cross-sectional diagram of a process according to the method of manufacturing the interconnection of the embodiment.

FIG. 3 is a schematic cross-sectional diagram (first process) of a process for forming an underlying metal film 4 in the via 3 illustrated in the schematic diagram of FIG. 2.

The underlying metal film 4 is formed on the bottom part of the via 3 by a manufacturing process of a general metal interconnection so as to be buried on the interconnection substrate 1 or in the interconnection substrate 1. The underlying metal film 4 is a thin film including any one of Ti, TiN, and TaN, a thin film formed of anyone of Ti, TiN, and TaN, or a laminated film thereof. For example, the underlying metal film 4 has a thickness of 1 nm or greater and 20 nm or less.

Figure 4:
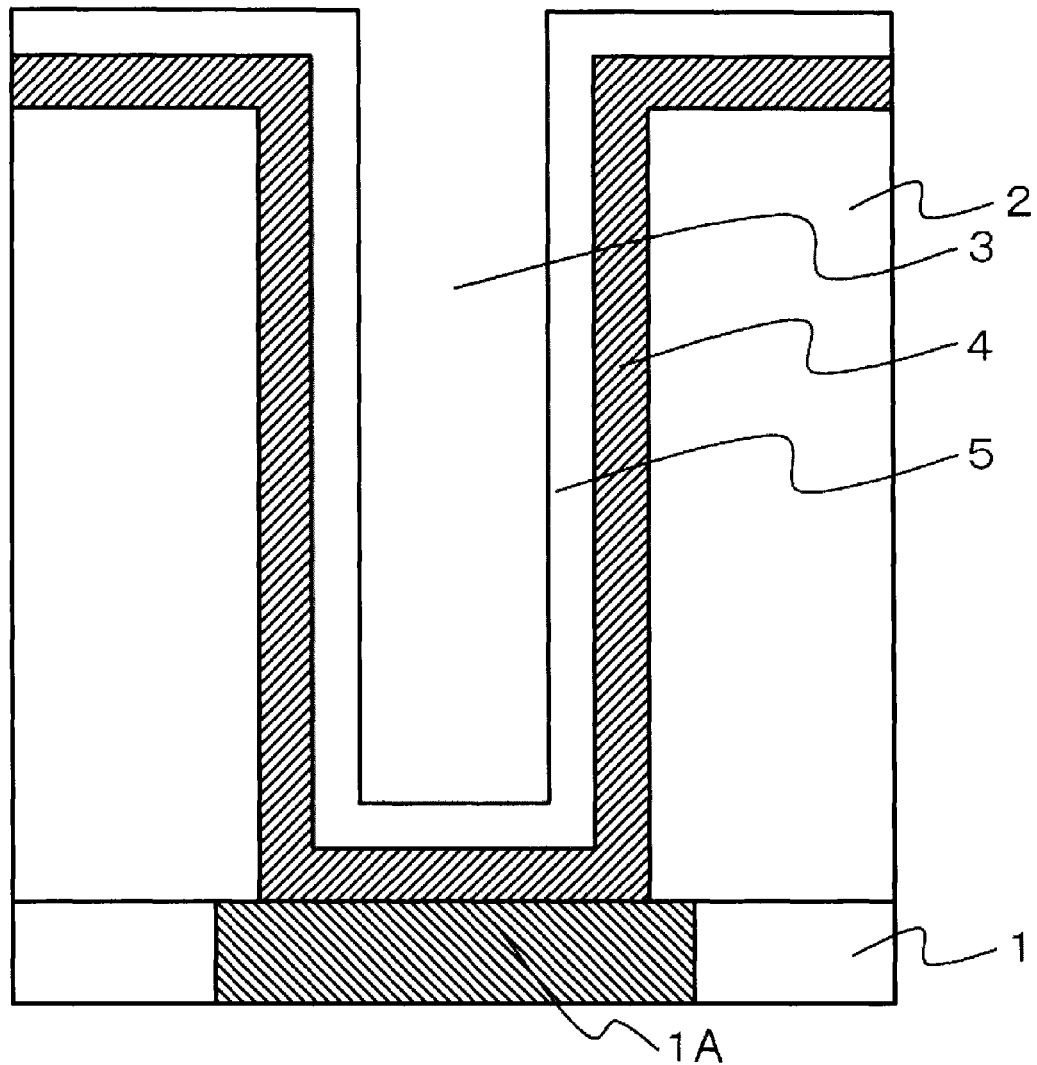
FIG. 4 is a schematic cross-sectional diagram of a process according to the method of manufacturing the interconnection of the embodiment.

FIG. 4 is a schematic cross-sectional diagram (second process) of a process for forming the catalyst metal inactivation film 5 in the via 3 illustrated in FIG. 3. The catalyst metal inactivation film 5 is formed by a general semiconductor manufacturing process such as a CVD (Chemical Vapor Deposition). The catalyst metal inactivation film 5 is formed not only on the sidewalls and the bottom surface of the via 3 but also on the outermost surface (region A) of the interlayer insulation film 2. The catalyst metal inactivation film 5 is a film which decreases a catalyst function even when a carbon growth catalyst is formed on this thin film. For example, the catalyst metal inactivation film 5 is a thin film including any one of Si, $SiO_2$, and SiN, a thin film formed of any one of Si, $SiO_2$, and SiN, or a laminated thin film formed in combination with anyone thin film of Si, $SiO_2$, and SiN. For example, the catalyst metal inactivation film 5 has a thickness of 1 nm or greater and 10 nm or less.

Figure 5:
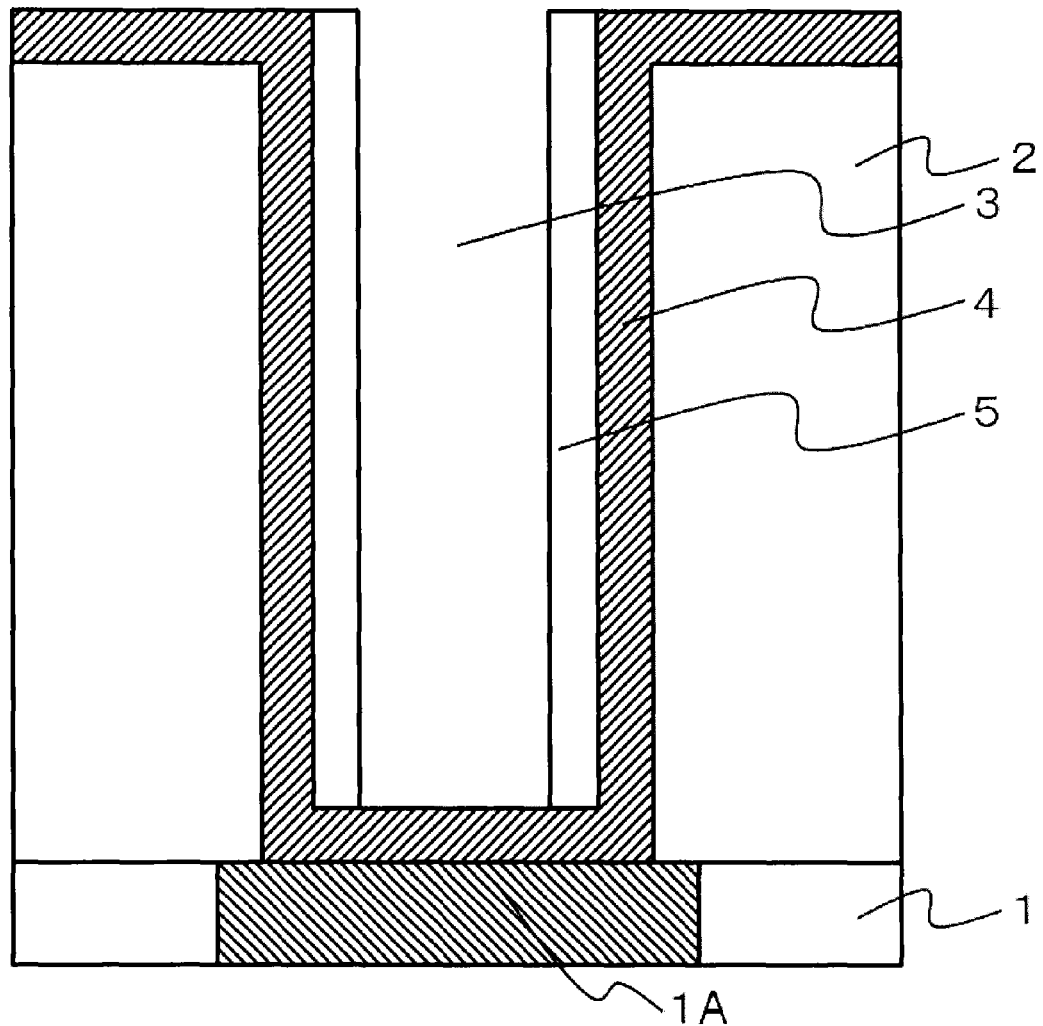
FIG. 5 is a schematic cross-sectional diagram of a process according to the method of manufacturing the interconnection of the embodiment.

FIG. 5 is a schematic cross-sectional diagram (third process) of a process for removing the catalyst metal inactivation film 5, which is formed on the bottom part of the via 3 and the outermost surface (region A) of the interlayer insulation film 2 as illustrated in the schematic diagram of FIG. 4. An example of a method of removing the catalyst metal inactivation film 5 formed on the bottom part of the via 3 may include a reactive ion etching using a chlorine-based gas. In this process, as the reactive ion etching, an etching having a high linearity is preferably performed (for example, see JP 2012-49261 A). Since the catalyst metal inactivation film 5 formed on the bottom part or the outermost surface of the via 3 is removed, the carbon growth is not inhibited at the bottom part of the via 3, whereas the carbon growth does not occur or is hardly generated from the sidewalls of the via 3. Since the catalyst metal inactivation film 5 remains on the sidewalls of the via 3, the carbon growth is suppressed from the sidewalls of the via 3 regardless of the presence or absence of the subsequent high-pressure plasma treatment. Accordingly, it is possible to perform the desired process by adjusting the pressure of a plasma gas within a required range without particularly worrying about the arrival of the plasma gas to the sidewalls of the via 3 in a fifth process.

Figure 6:
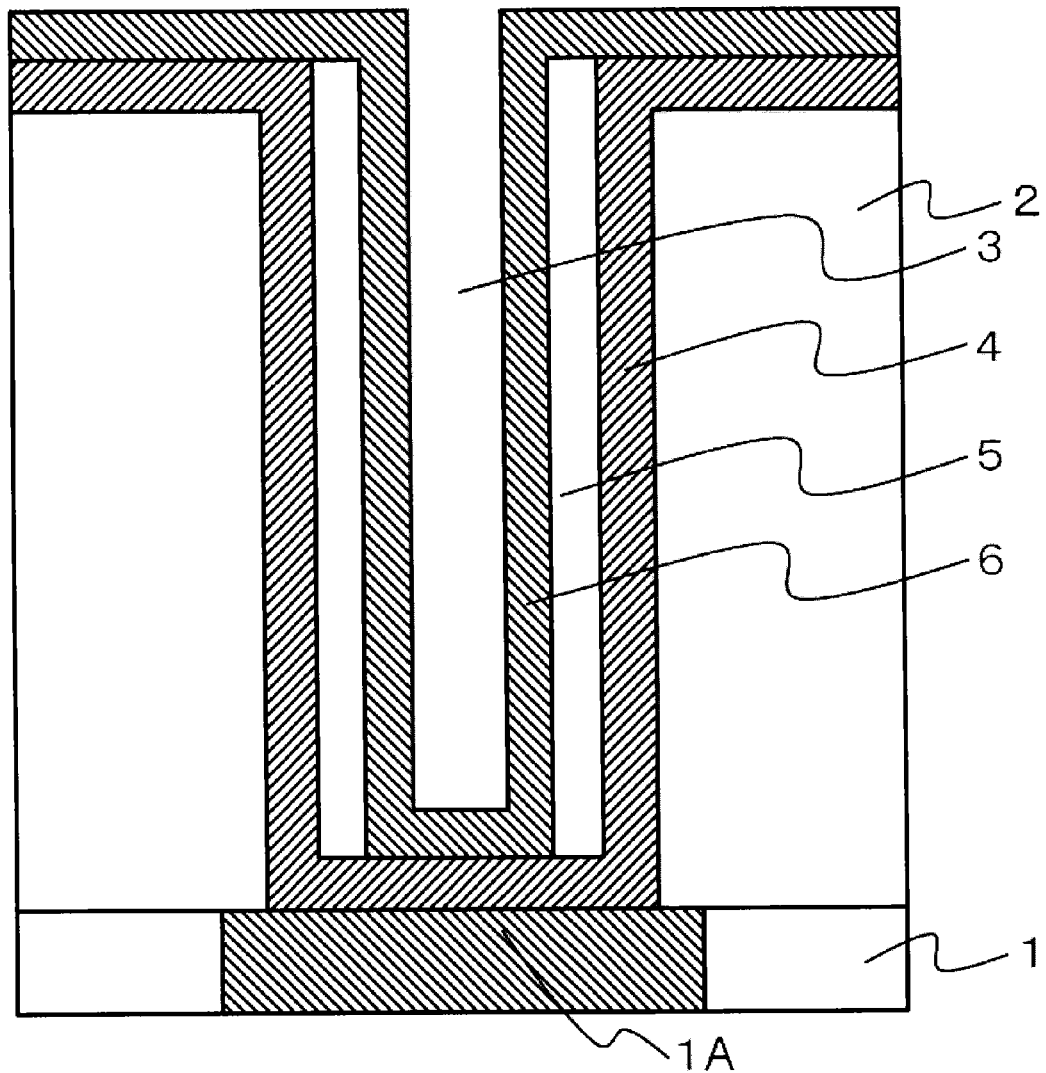
FIG. 6 is a schematic cross-sectional diagram of a process according to the method of manufacturing the interconnection of the embodiment.

FIG. 6 is a schematic cross-sectional diagram (fourth process) of a process for forming the catalyst metal film 6 in the via 3 illustrated in the schematic diagram of FIG. 5. Preferably, the CVD capable of easily forming the metal film up to the bottom part of the via 3 is used as a method of forming the catalyst metal film 6. An example of the catalyst metal used in the catalyst metal film 6 includes a metal selected from materials such as Co, Ni, Fe, Cu, Ru, and Pt having a catalytic action suitable for the CNT growth, an alloy including the above metals, or an alloy including metals of two or more kinds selected from the group consisting of the above metals. The catalyst metal film 6 is formed not only on the sidewalls and the bottom surface of the via 3 but also on the outermost surface (region A) of the interlayer insulation film 2. The thickness of the catalyst metal film 6 is 1 nm or greater and 5 nm or less, which is suitable for the CNT growth.

Figure 7:
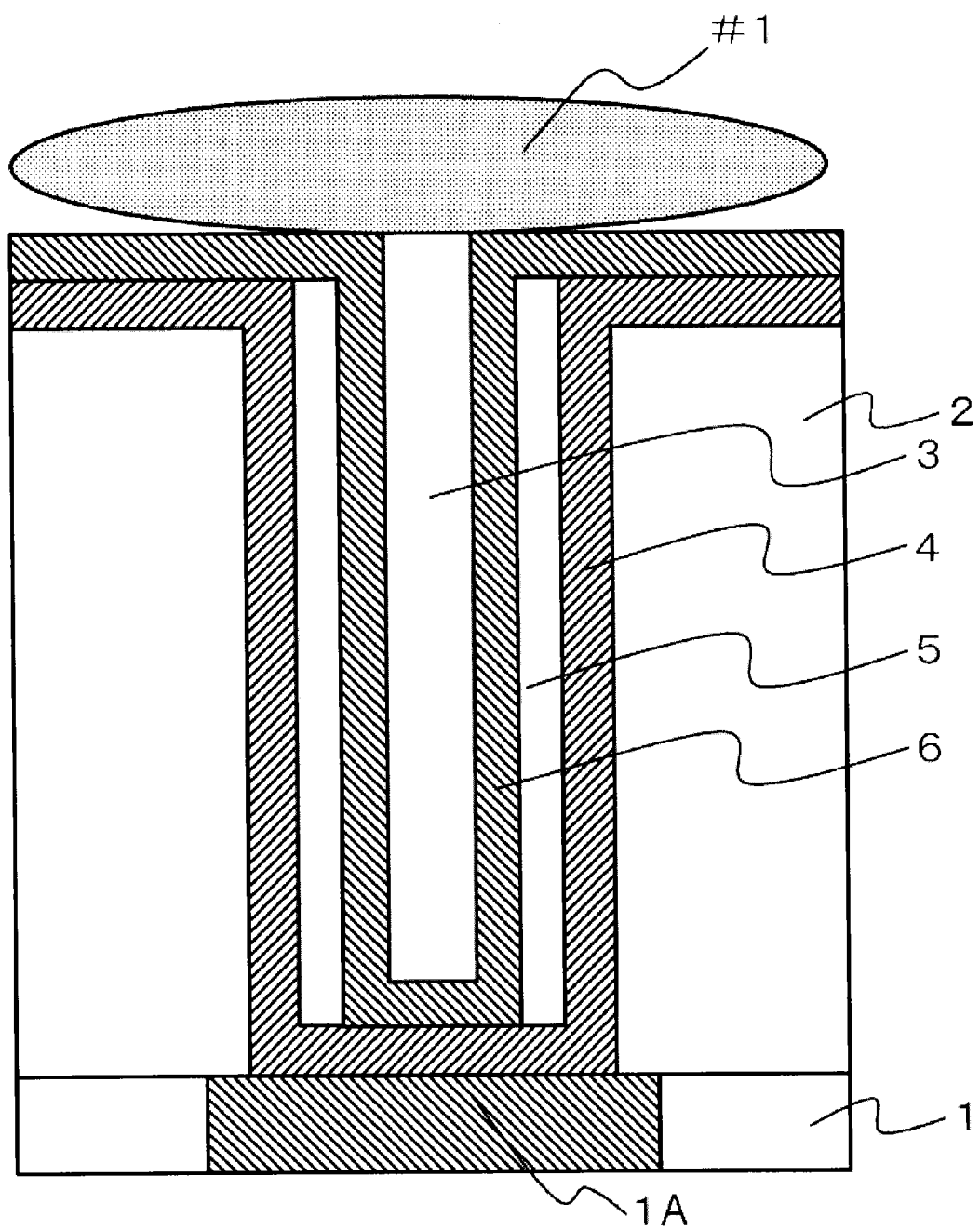
FIG. 7 is a schematic cross-sectional diagram of a process according to the method of manufacturing the interconnection of the embodiment.

FIG. 7 is a schematic cross-sectional diagram (fifth process) of a process for performing a first plasma treatment on the outermost surface (region A) of the interlayer insulation film 2 illustrated in the schematic diagram of FIG. 6.

The first plasma treatment is an inactivation treatment of the catalyst metal of the region A in which the CNT growth is unnecessary. As illustrated in FIG. 7, the first plasma treatment is performed with a high-pressure plasma #1 compared to the subsequent second plasma treatment. By performing the inactivation treatment of the catalyst of the region A, the CNT growth disappears or hardly remains in the region A, and thus the subsequent CMP processing can be easily performed. The first plasma treatment is performed using gases including at least one kind of gases not containing the carbon, for example, selected from $H_2$, He, $N_2$, $O_2$, and Ar. The first plasma treatment is performed under conditions where the mean free path of the plasma gas is short and the plasma gas reaches the region A and does not reach the bottom part of the via 3. In order to shorten the mean free path of the plasma gas, the plasma treatment is preferably performed with high gas pressure. A specific gas pressure is 1 Torr or more and 760 Torr or less (133.3 Pa or more and 101325 Pa or less). For example, when the gas pressure is not more than 1 Torr (less than 133.3 Pa), there are some cases where the plasma gas reaches the bottom part of the via 3 having a diameter of 100 nm, and thus it is unfavorable that the catalytic activation of the bottom part of the via 3 decreases to have a bad influence on the CNT growth. When the first plasma treatment is performed with ten or more times the gas pressure of the second plasma treatment to be described below, it is preferable on the grounds that the plasma gas is difficult to reach up to the bottom part of the via 3. Preferably, the first plasma treatment is performed at a room temperature or higher and a CNT growth treatment temperature or lower, and more preferably, it is performed at a relatively low temperature. Specifically, it is preferable that the first plasma treatment be performed at 25° C. or higher and 400° C. or lower.

Figure 8:
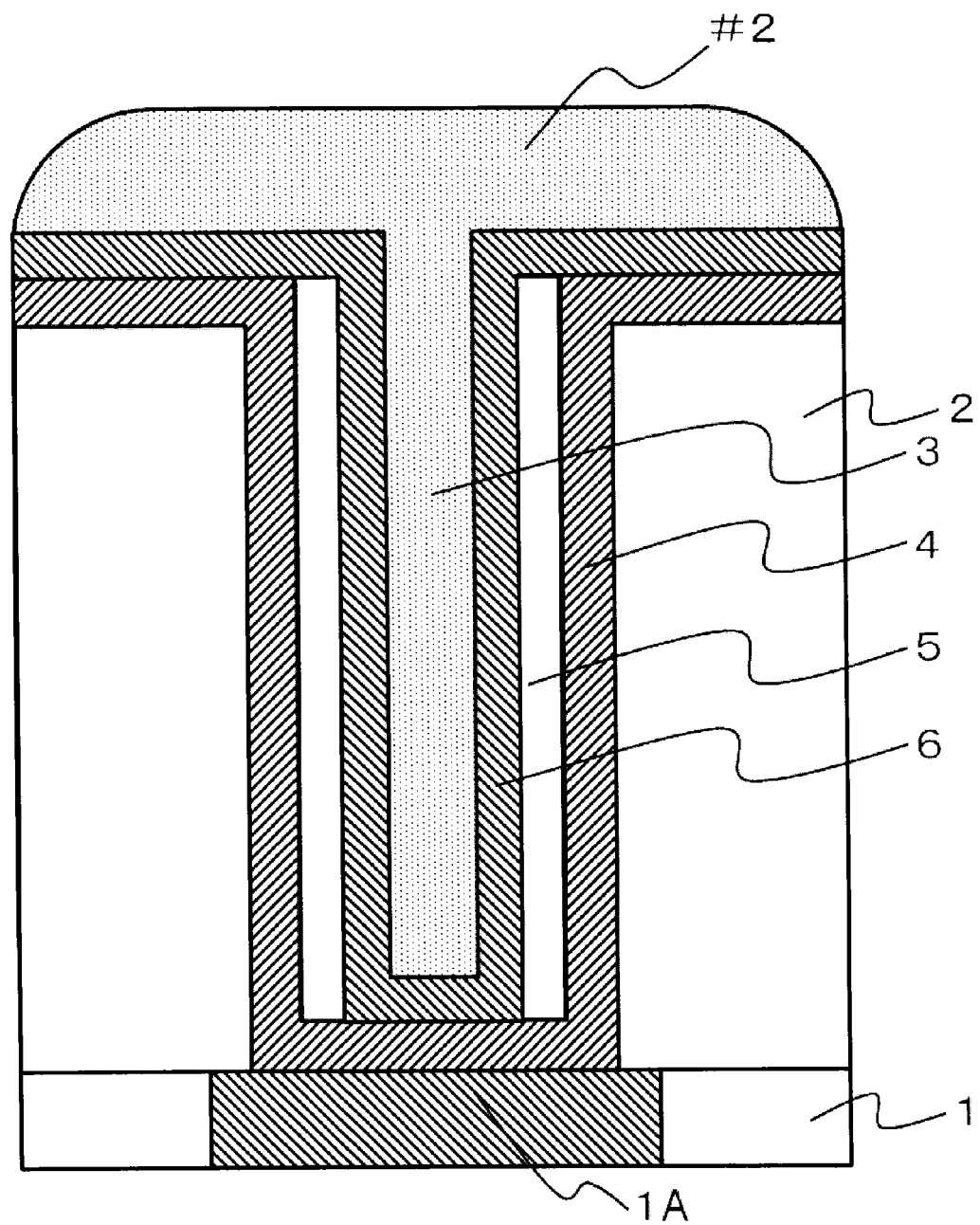
FIG. 8 is a schematic cross-sectional diagram of a process according to the method of manufacturing the interconnection of the embodiment.

FIG. 8 is a schematic cross-sectional diagram (sixth process) of a process for performing the second plasma treatment on the member illustrated in the schematic diagram of FIG. 7. The second plasma treatment is a treatment for improving a catalytic activation level of the catalyst metal which is not inactivated by the first plasma treatment. As illustrated in FIG. 8, the second plasma treatment is performed with a low-pressure plasma #2 compared to the previous first plasma treatment. In the second plasma treatment, the plasma treatment is performed up to the bottom part of the via 3 as a starting point of the CNT growth to facilitate the CNT growth from the bottom part of the via 3. The second plasma treatment is performed using gases including at least one kind of gases not containing the carbon, for example, selected from $H_2$, He, Ar, and $N_2$. The second plasma treatment is performed under conditions where the mean free path of the plasma gas is long and the plasma gas reaches not only the region A but also the bottom part of the via 3. In order to lengthen the mean free path of the plasma gas, the plasma treatment is preferably performed with low gas pressure. In order to improve the effect of the plasma treatment on the bottom part of the via 3, it is preferable to make the gas pressure of the plasma treatment as low as possible. A specific gas pressure is 0.001 Torr or more and 0.1 Torr or less (0.1333 Pa or more and 13.33 Pa or less). For example, when the gas pressure is 1 Torr or more (133.3 Pa or more), there are some cases where the plasma gas does not reach the bottom part of the via 3 having a diameter of 100 nm, and thus it is unfavorable that the catalytic activation of the bottom part of the via 3 is not improved to have a bad influence on the CNT growth. Preferably, the second plasma treatment is performed at a room temperature or higher and a CNT growth treatment temperature or lower, and more preferably, it is performed at a high temperature compared to the first plasma treatment and a low temperature compared to the subsequent first carbon growth treatment. Specifically, it is preferable that the second plasma treatment is performed at 150° C. or higher and 600° C. or lower.

In addition, since the catalyst metal is inactivated even when the inactivation treatment is performed after the plasma treatment for the purpose of improving the activation level, the similar treatment effects can be obtained even in a case of exchanging the process of the first plasma treatment with that of the second plasma treatment. Therefore, either the first plasma treatment or the second plasma treatment may be performed in any order of priority. In addition, one or both of the first plasma treatment and the second plasma treatment may be performed plural times. When the plasma treatment is performed plural times, it may be treated with plasma gases of different active species using different feedstock gases in each treatment. This is reason because the plasma effect of the catalyst metal is different due to the feedstock gas. For example, $H_2$ has a strong reducing action, and $N_2$ has an effect of changing a metal crystal structure.

Figure 9:
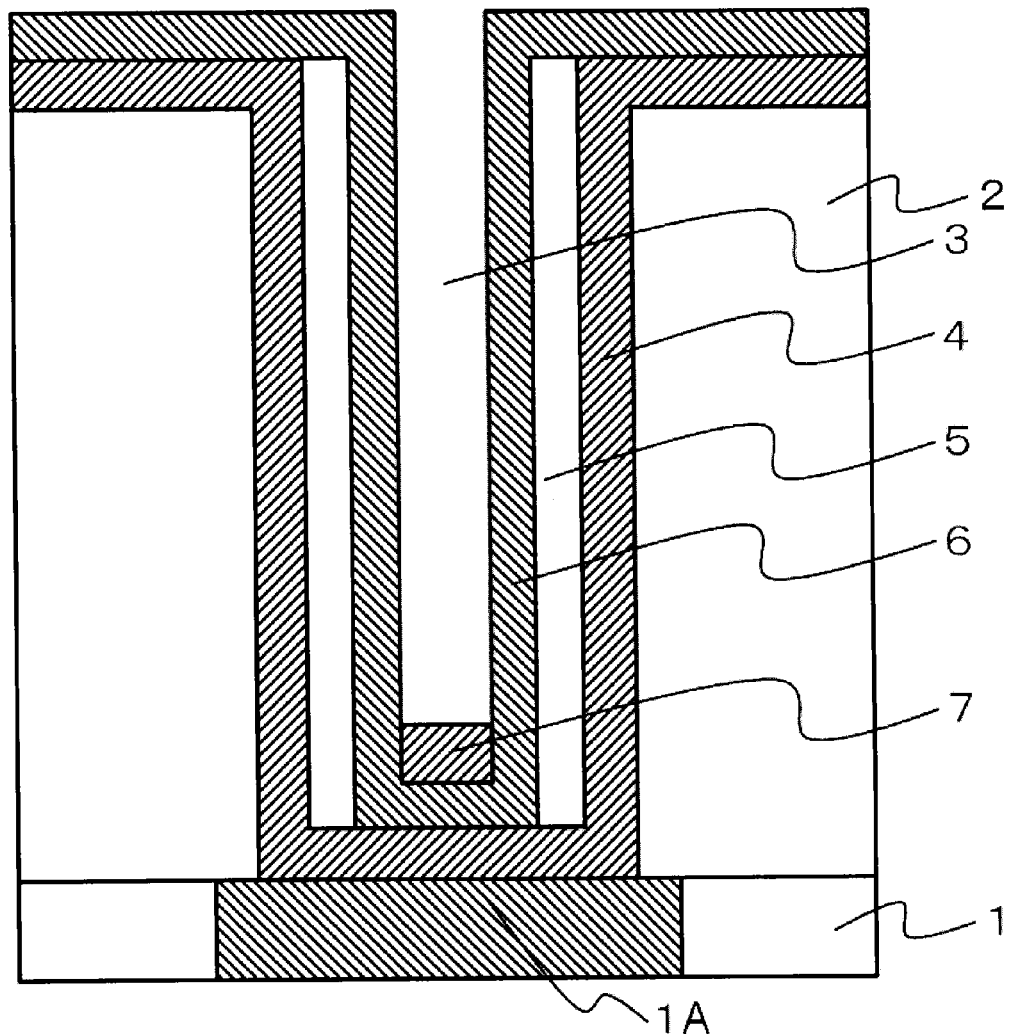
FIG. 9 is a schematic cross-sectional diagram of a process according to the method of manufacturing the interconnection of the embodiment.

FIG. 9 is a schematic cross-sectional diagram (seventh process) of a process for performing the first carbon growth treatment on the member illustrated in the schematic diagram of FIG. 8. The first carbon growth treatment is a plasma treatment for forming a crystal seed as a starting point of the CNT growth. The catalyst metal is subjected to the plasma treatment to form a graphite layer of about several nm on the catalyst metal. The formed graphite layer becomes a crystal nucleus of the CNT growth. Preferably, the first carbon growth process is performed using a plasma gas having a relatively high plasma power density. The feedstock gas is a gas containing hydrocarbon. Specifically, it is preferable that the feedstock gas be a gas containing at least one kind selected from the group consisting of methane, acetylene, benzene, and alcohol (such as ethanol). The feedstock gas may contain hydrogen, nitrogen, carbon monoxide, carbon dioxide, and rare gas in addition to the hydrocarbon. Since the first carbon growth is required to be performed at a low temperature compared with the second carbon growth and at a temperature at which the graphite layer can be formed, for example, the treatment temperature of the first carbon growth preferably has 150° C. or higher and 600° C. or lower. Further, since this treatment process is sufficient as long as the graphite layer is formed to have about several nm, the treatment time may be short, specifically from about 0.1 seconds to 5 minutes. When the treatment time is long, it is unfavorable that the decrease of the catalytic activation level or the low crystalline CNT growth occurs due to the low temperature treatment.

Figure 10:
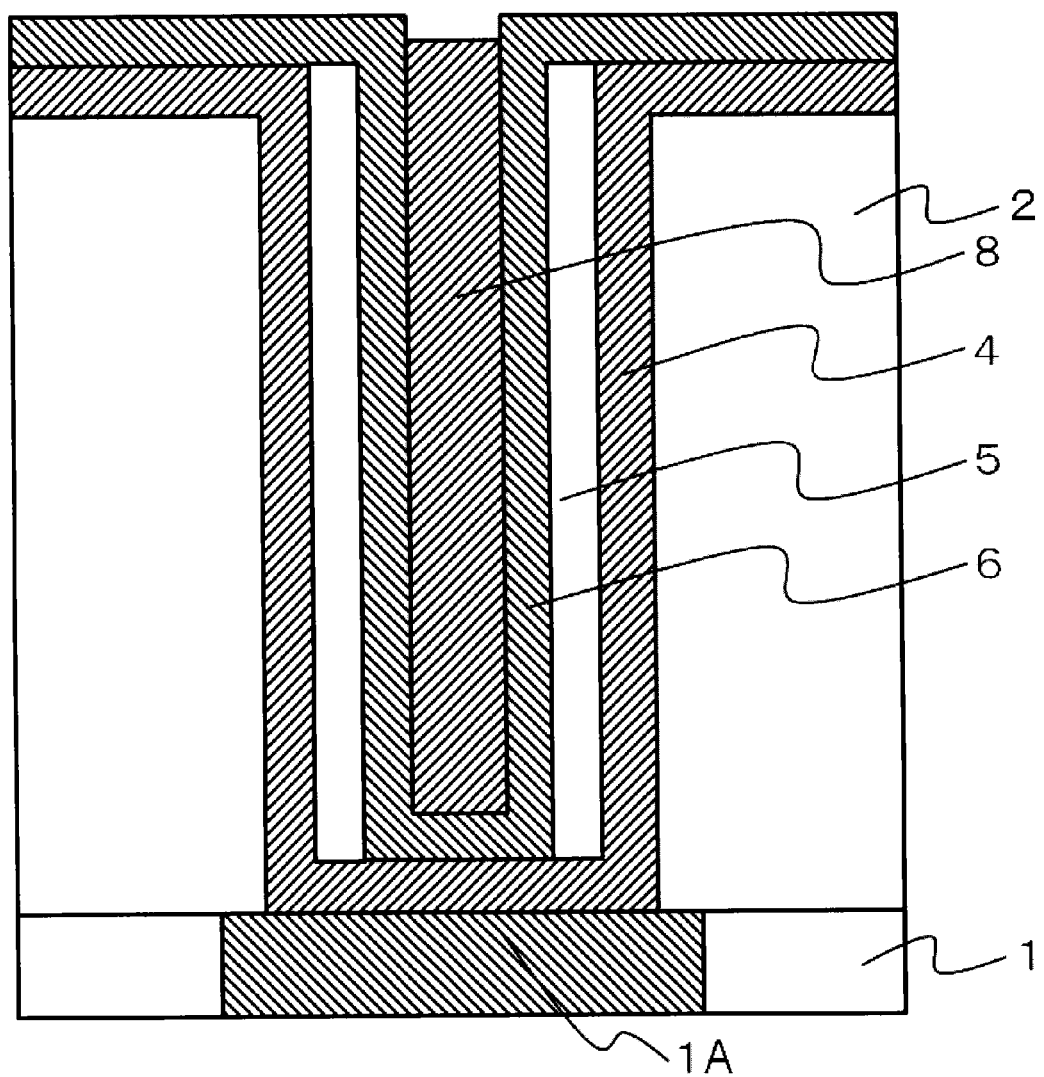
FIG. 10 is a schematic cross-sectional diagram of a process according to the method of manufacturing the interconnection of the embodiment.

FIG. 10 is a schematic cross-sectional diagram (eighth process) of a process for performing the second carbon growth treatment on the member illustrated in the schematic diagram of FIG. 9. The process is a treatment which causes the growth (extension) of a CNT 8 from a seed 7 formed by the seventh process. The second carbon growth process includes the plasma treatment or thermal CVD treatment. In a case of performing the plasma treatment, it is preferable that the plasma gas having a sufficiently low plasma power density is used to cause the growth of CNT with a high crystal quality. Preferably, the feedstock gas of the eighth process is the same as in the seventh process, but is not limited thereto. Preferably, the treatment temperature of the eighth process is 400° C. or higher and 800° C. or lower. When the first and second plasma treatments and the formation treatment of the graphite layer are performed as intended, it is possible to obtain the CNT 8 grown with a high crystal quality and a high-density of $1 \times 10^{11}$ or more in this process. Particularly, when the inactivation treatment of the catalyst would be performed on the bottom part of the via 3, it is not possible to obtain the above CNT 8. Each of the crystal quality and the density of the CNT 8 can be perceived from the interconnection image captured by a transmission-type electron microscope and a scanning-type electron microscope.

After the eighth process, it is possible to form a semiconductor device of a multilayered substrate by forming a SOD film, polishing it by a CMP (Chemical and Mechanical Polishing), and forming a separate interconnection substrate on the upper surface of the via 3, using a known semiconductor manufacturing process as necessary. This embodiment can suppress the CNT growth from the outermost surface by the treatment for suppressing the CNT growth from the outermost surface, and thus the manufacturing method of this embodiment is advantageous in making the thickness of the SOD film thin, and simplifying the CMP process.

(Second Embodiment)

Figure 11:
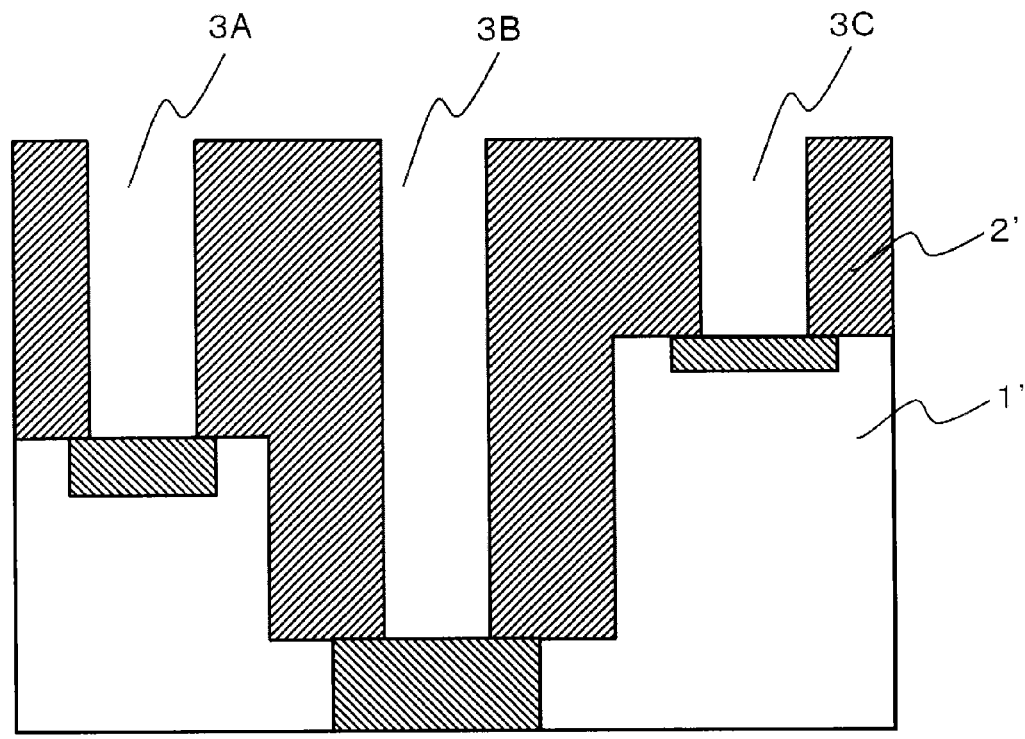
FIG. 11 is a schematic cross-sectional diagram of a process according to the method of manufacturing the interconnection of the embodiment.

A second embodiment is the same as the first embodiment except the sixth process. FIG. 11 is a schematic cross-sectional diagram of a member for forming a via interconnection of the second embodiment. A plurality of vias 3A, 3B, and 3C having different depths are formed in the schematic diagram of FIG. 11. As described above, when the vias are different from each other in depth, it is possible to perform a desired treatment by adjusting the plasma gas pressure of the sixth process. When the depth of the via 3 is deep, it is possible to treat with a relatively low pressure plasma gas within the above range. On the other hand, when the depth of the via 3 is shallow, it is possible to treat with a relatively high pressure plasma gas within the above range.

Accordingly, even when a plurality of interconnections are formed such that the via 3 has different depths, it is possible to achieve the desired treatment by appropriately adjusting the sixth process.

(Third Embodiment)

Figure 12:
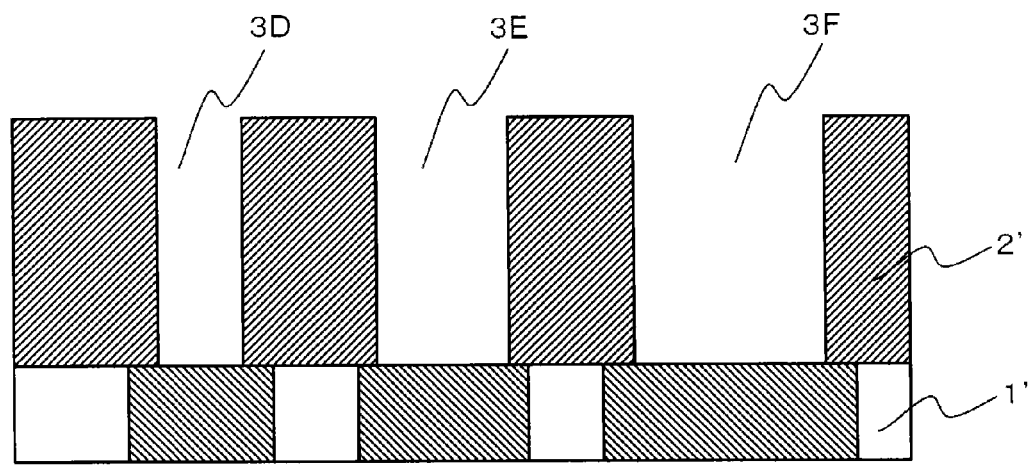
FIG. 12 is a schematic cross-sectional diagram of a process according to the method of manufacturing the interconnection of the embodiment.

A third embodiment is the same as the first embodiment except the sixth process. FIG. 12 is a schematic cross-sectional diagram of a member for forming the via interconnection of the second embodiment. A plurality of vias 3D, 3E, and 3F having different diameters are formed in the schematic diagram of FIG. 12. As described above, when the vias are different from each other in diameter, it is possible to perform a desired treatment by adjusting the plasma gas pressure of the fifth process. When the diameter of the via 3 is small from 10 nm to several tens of nm, it is possible to treat with a relatively low pressure plasma gas within the above range. On the other hand, when the diameter of the via 3 has a size of about 1000 nm, it is possible to treat with a relatively high pressure plasma gas within the above range.

Accordingly, even when a plurality of interconnections are formed such that the via 3 has different diameters, it is possible to achieve the desired treatment by appropriately adjusting the sixth process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing an interconnection, the method comprising:
forming a via which penetrates an interlayer insulation film on a substrate;
forming an underlying film in the via;
removing the underlying film on a bottom part of the via;
forming a catalyst metal inactivation film on the underlying film;
removing the catalyst metal inactivation film on the bottom part of the via;
forming a catalyst metal film on the bottom part of the via on which the catalyst metal inactivation film is removed;
performing a first plasma treatment and a second plasma treatment using a gas not containing carbon on a member in which the catalyst metal film is formed;
forming a graphite layer on the catalyst metal film after the first and second plasma treatment processes; and
causing a growth of a carbon nanotube from the catalyst metal film on which the graphite layer is formed,
wherein a plasma gas pressure of the first plasma treatment is higher than that of the second plasma treatment.

2. The method according to claim 1, wherein the gas pressure of the first plasma treatment is 133.3 Pa or more and 101325 Pa or less.

3. The method according to claim 1, wherein the gas pressure of the second plasma treatment is 0.1333 Pa or more and 13.33 Pa or less.

4. The method according to claim 1, wherein the gas pressure of the first plasma treatment is ten or more times the gas pressure of the second plasma treatment.

5. The method according to claim 1, wherein a treatment temperature of the first plasma treatment is lower than that of the second plasma treatment.

6. The method according to claim 1, wherein a treatment temperature of the first plasma treatment is 25° C. or higher and 400° C. or lower.

7. The method according to claim 1, wherein a treatment temperature of the second plasma treatment is 150° C. or higher and 600° C. or lower.

8. The method according to claim 1, wherein the gas not containing the carbon of the first plasma treatment contains at least one selected from the group consisting of $H_2$, He, $N_2$, $NH_3$, $O_2$, and Ar.

9. The method according to claim 1, wherein the gas not containing the carbon of the second plasma treatment contains at least one selected from the group consisting of $H_2$, He, $ArN_2$, and $NH_3$.

10. The method according to claim 1, wherein one or both of the first plasma treatment and the second plasma treatment are performed plural times.

11. The method according to claim 10, wherein the plasma treatment is performed with a plasma gas containing different active species when being performed plural times.

12. The method according to claim 1, wherein the first plasma treatment is performed such that plasma gas does not reach the bottom part of the via.

13. The method according to claim 1, wherein the second plasma treatment is performed such that plasma gas reaches the bottom part of the via.

14. The method according to claim 1, wherein a density of the carbon nanotube is $1 \times 10^{11}$ or more.

15. A method of manufacturing a semiconductor device, the method comprising:
forming a via which penetrates an interlayer insulation film on a substrate;
forming an underlying film in the via;
removing the underlying film on a bottom part of the via;
forming a catalyst metal inactivation film on the underlying film;
removing the catalyst metal inactivation film on the bottom part of the via;

forming a catalyst metal film on the bottom part of the via on which the catalyst metal inactivation film is removed;

performing a first plasma treatment and a second plasma treatment using a gas not containing carbon on a member in which the catalyst metal film is formed;

forming a graphite layer on the catalyst metal film after the first and second plasma treatment processes; and causing a growth of a carbon nanotube from the catalyst metal film on which the graphite layer is formed, wherein the method of manufacturing an interconnection of the semiconductor device employs a method of manufacturing an interconnection in which a plasma gas pressure of the first plasma treatment is higher than that of the second plasma treatment.

16. The method according to claim 15, wherein the gas pressure of the first plasma treatment is 133.3 Pa or more and 101325 Pa or less.

17. The method according to claim 15, wherein the gas pressure of the second plasma treatment is 0.1333 Pa or more and 13.33 Pa or less.

18. The method according to claim 15, wherein the gas pressure of the first plasma treatment is ten or more times the gas pressure of the second plasma treatment.

19. The method according to claim 15, wherein a treatment temperature of the first plasma treatment is lower than that of the second plasma treatment.

20. The method according to claim 15, wherein a treatment temperature of the first plasma treatment is 25° C. or higher and 400° C. or lower.

21. The method according to claim 15, wherein a treatment temperature of the second plasma treatment is 150° C. or higher and 600° C. or lower.

22. The method according to claim 15, wherein the gas not containing the carbon of the first plasma treatment contains at least one selected from the group consisting of $H_2$, He, $N_2$, $NH_3$, $O_2$, and Ar.

23. The method according to claim 15, wherein the gas not containing the carbon of the second plasma treatment contains at least one selected from the group consisting of $H_2$, He, $ArN_2$, and $NH_3$.

24. The method according to claim 15, wherein one or both of the first plasma treatment and the second plasma treatment are performed plural times.

25. The method according to claim 24, wherein the plasma treatment is performed with a plasma gas containing different active species when being performed plural times.

26. The method according to claim 15, wherein the first plasma treatment is performed such that plasma gas does not reach the bottom part of the via.

27. The method according to claim 15, wherein the second plasma treatment is performed such that plasma gas reaches the bottom part of the via.

28. The method according to claim 15, wherein a density of the carbon nanotube is $1 \times 10^{11}$ or more.

* * * * *